United States Patent
Moon et al.

[11] Patent Number: 5,892,726
[45] Date of Patent: Apr. 6, 1999

[54] ADDRESS DECODER

[75] Inventors: Yoojoon Moon, Ushiku; Shunichi Sukegawa, Tsukuba; Yasuhito Ichimura, Kasama; Makoto Saeki, Hamura, all of Japan

[73] Assignees: Texas Instruments Incorporated, Dallas, Tex.; Hitachi Ltd., Japan

[21] Appl. No.: 721,294

[22] Filed: Sep. 26, 1996

[30] Foreign Application Priority Data

Sep. 26, 1995 [JP] Japan .................................. 7-271700

[51] Int. Cl.⁶ ...................................................... G11C 8/00
[52] U.S. Cl. ...................................... 365/230.06; 326/105
[58] Field of Search ....................... 365/230.06; 326/105, 326/108, 113

[56] References Cited

U.S. PATENT DOCUMENTS

| | | | |
|---|---|---|---|
| 5,365,489 | 11/1994 | Jeong | 365/230.06 |
| 5,469,391 | 11/1995 | Haraguchi | 365/230.06 |
| 5,528,177 | 6/1996 | SridhAr et al. | 326/113 |
| 5,539,698 | 7/1996 | Suzuki | 365/200 |

*Primary Examiner*—David Nelms
*Assistant Examiner*—M. Tran
*Attorney, Agent, or Firm*—Bret J. Petersen; Richard L. Donaldson

[57] ABSTRACT

An address decoder with low power consumption of feedthrough current, leakage current, etc. Address bits $AY0_0$–$AY0_7$ are respectively supplied to n-type gate terminals of CMOS transfer gates $C_0$–$C_7$ and the gate terminals of PMOS transistors $P_0$–$P_7$. Inverted address bits $AY0_{0-}$–$AY0_{7-}$ are supplied to p-type gate terminals of the CMOS transfer gates $C_0$–$C_7$. Enable signals $AY3_p$, $AY6_q$ are respectively input to both input terminals of a NAND circuit 10. The output terminals of NAND circuit 10 are connected to the input terminals of CMOS transfer gates $C_0$–$C_7$. The output terminals of CMOS transfer gates $C_0$–$C_7$ are connected to the input terminals of the drivers $D_0$–$D_7$ and the drain terminals of the PMOS transistors $P_0$–$P_7$ via a node $F_0$–$F_7$. The source terminals of PMOS transistors $P_0$–$P_7$ are connected to a power supply voltage $V_{cc}$, for example of 3.3 V. The output terminals of drivers $D_0$–$D_7$ are connected to Y-address lines $YS_0$–$YS_7$.

7 Claims, 6 Drawing Sheets

ADDRESS DECODER

FIELD OF THE INVENTION

Our invention relates to an address decoder for semiconductor memories, such as DRAMs.

BACKGROUND OF THE INVENTION

A typical conventional dynamic random-access memory (DRAM) 5 is shown in FIG. 4, and each portion of the signals, the waveform of the data, and the timing during memory access in this DRAM are shown in FIG. 5.

When data is read from the DRAM, a row address strobe signal RAS_ and column address strobe signal CAS_ are supplied along with the memory address signal.

First, by enabling the RAS_ signal of FIG. 5(A), along with completing the precharge of each bit line in memory array 100, a slightly delayed row address signal $BX_i$ shown in FIG. 5(B) is read into an X-address decoder (not shown) of the row address system, and the designated row's word line WLi is activated by this row address signal as shown in FIG. 5(C). By activating word line $WL_i$, the stored information (data) in each memory cell MC connected to this word line is read out on a corresponding bit line BL as shown in FIG. 5(D). Then the read data is input, together with complementary data on a complementary bit line BL_, to each bit line's sense amplifier SA and differentially amplified there.

On the other hand, when a column address signal $BY_j$ is input or latched in a Y-address buffer 102 at the prescribed timing shown in FIG. 5(E), an address transition detector (ATD) circuit 104 operates in response.

ATD circuit 104 houses circuits that generate an ATD pulse, an FY pulse, an MA pulse, and an MAEQ pulse. First, ATD circuit 104 generates, in an internal unit, an ATD pulse shown in FIG. 5(G) in response to a transition or change of the input column address signal $BY_j$. Next, in response to the rise and fall of the ATD pulse, it outputs an FY pulse that determines the activation time of a Y-address line YS and the enable time of a sense amplifier SA.

The DRAM's column address decoder has a predecoder 116 and a Y-address decoder 118. In response to the FY pulse, predecoder 116 uses a column address signal $BY_j$ from the Y-address buffer 102 to form a predecoded column address signal $AY_j$ and applies it to Y-address decoder 118. Y-address decoder 118 decodes the column address signal $BY_j$ and activates the Y-address line $YS_j$ for the column indicated by signals $BY_j$ and $AY_j$ for an interval determined by the FY pulse.

Activating Y-address line $YS_j$ turns on an output transfer gate TR of the sense amplifier $SA_j$ connected to $YS_j$, and the complementary readout data pair IO, IO_ that have been amplified by this sense amplifier $SA_j$ are respectively output to the data input/output lines IO and data input/output complementary line IO_ (FIG. 5(K)).

Also, an IO switch 120 of the memory array external unit that is connected to the sense amplifier $SA_j$ is also turned on, and the memory readout data IO, IO_ from sense amplifier $SA_j$ are sent to main amplifiers 122 via IO switch 120, memory array external data input/output line MIO and its complementary line MIO_, and a node EQ.

On the other hand, ATD circuit 104 responds to internal ATD pulse ATD by outputting an MA pulse shown in FIG. 5(J) to activate main amplifier 122 and an MAEQ pulse shown in FIG. 5(H) for blocking the amplification operation by equalizing (shorting) a prescribed node EQ within main amplifier 122.

When signal MAEQ falls, main amplifier 122 begins amplifying the data IO, IO_ read out by sense amp $SA_j$ and outputs corresponding readout data GIO, GIO_ at specified voltage levels as shown in FIG. 5(L). When the MA signal cuts off, main amplifier 122 is deactivated and the amplified memory readout data GIO, GIO_ is latched as the data signal DQ in an output buffer 124 as shown in FIG. 5(M).

In a write operation, the data to be written to the DRAM is sent to sense amplifiers SA from a prescribed data transmission circuit (not shown) via main amplifier 122, and from there is written to the desired memory cell MC through the bit line BL.

In FIG. 6, shows Y-address decoder 118 for the case in which memory array 100 has 512 Y-address lines. In this example, there are 64 column decoders $DEC_0$–$DEC_{63}$ arranged in parallel and grouped into eight blocks $BL_0$–$BL_7$. Each column decoder $DEC_n$ has its output terminals coupled to eight Y-address lines YS.

The column address signal AY from predecoder 116 comprises first, second, and third partial address signals $AY0_{0-7}$, $AY3_{0-7}$, and $AY6_{0-7}$, each having 8 bits. In each of these partial address signals ($AY0_{0-7}$, $AY3_{0-7}$, $AY6_{0-7}$), only one of the eight bits, for example, $AY0_3$, $AY3_5$, $AY6_1$, is at a logic level of 1, and the remaining bits are 0. As a result, starting from the right, $AY6_1$ indicates decoder block $BL_1$, $AY3_5$ the fifth column decoder $DEC_5$ in block BL1, and $AY0_3$ the third AY-address line YA3

The circuit construction of a conventional column decoder DEC is shown in FIG. 7. This column decoder is constructed of eight NMOS transistors $K_0$–$K_7$, PMOS transistors $U_0$–$U_7$, and inverter drivers $D_0$–$D_7$, respectively, and the two NMOS transistors 130, 132.

The address bits $AY0_0$–$AY0_7$ of the first partial address signals $AY0_{0-7}$ are respectively applied to the gate terminals of NMOS transistors $K_0$–$K_7$. The drain terminals of the NMOS transistors $K_0$–$K_7$, along with being connected to the respective input terminals of the drivers $D_0$–$D_7$, are connected to the power supply voltage $V_{cc}$ terminal of, for example, 3.3 V, through the respective PMOS transistors $U_0$–$U_7$. The source terminals of NMOS transistors $K_0$–$K_7$ are connected to the power supply voltage $V_{ss}$ terminal of, for example, 0 V, through the common NMOS transistors 130, 132.

The corresponding address bits $AY3_p$ (p=0–7) within the second partial address signal $AY3_{0-7}$ are applied to the gate terminal of the NMOS transistor 130. The corresponding address bits $AY6_q$ (q=0–7) within the third partial address signal $AY6_{0-7}$ are applied to the gate terminal of the NMOS transistor 132. These address bits $AY3_p$, $AY3_q$ serve as enable signals for selecting this column decoder.

For the convenience of explanation, the eight Y-address lines that are respectively connected to the output terminals of the drivers $D_0$–$D_7$ in this column decoder are called $YS_0$–$YS_7$.

As for the PMOS transistors $U_0$–$U_7$ in this column decoder, their respective gate terminals are connected to the power supply voltage $V_{ss}$ at the L level (0 V), and are always on.

In the interval in which the column address signal $AY_j$ is not applied, or even when a column address signal $AY_j$ is applied, to the extent that at least one of the enable signals (address bits) $Ay3_p$, $Ay6_q$ is at a logic level of 0 (L level), in other words, to the extent that this column decoder is not selected, at least one of the common transistors 130, 132 is in off, and all of the nodes $E_0$–$E_7$ between the drain terminals of NMOS transistors $K_0$–$K_7$ and the drivers $D_0$–$D_7$ are precharged to a logic level of 1 (H level). Therefore, the output voltage of all of the drivers $D_0$–$D_7$ are at the L level, and all of the Y-address lines $YS_0$–$YS_7$ are maintained in the disabled state.

In the event that the column address signal $AY_j$ is applied to the memory access, and both enable signals (address bits) $AY3_p$, $AY6_q$ are at a logic level of 1 (H level), whichever one of the NMOS transistors $K_j$ that receives a bit $AY_j$ at a logic level of 1 (H level) within the address bits $AY_0$–$AY_7$ of the first partial address signal $AY0_{0-7}$ at its gate terminal turns on. All of the other NMOS transistors $K_0$–$K_{j-1}$, $K_{j+1}$–$K_7$ remain off.

When this is done, the node $E_j$ is discharged through the NMOS transistor $K_j$ that is on and the common transistors 130, 132; as a result, the potential of this node $E_j$ goes to the L level and the output voltage of the driver $D_j$ begins to rise to the H level, and in this way, the Y-address line $YS_j$ is enabled. Since the other nodes $E_0$–$E_{j-1}$, $E_{j+1}$–$E_7$ are maintained at the H level, the output voltages of the drivers $D_0$–$D_{j-1}$, $D_{j+1}$–$D_7$ that are connected to these nodes remain at the L level, and the Y-address lines other than the Y-address line $YS_j$ of $YS_0$–$YS_{j-}$, $YS_{j+1}$–$YS_7$ all remain disabled.

When this memory access is completed and the column address signal $AY_j$ is cut, the NMOS transistor $K_j$ and the common transistors 130, 132 that have thus for been on are turned back off, and node $E_j$ is precharged to the H level by means of the power supply voltage $V_{cc}$ through the PMOS transistor $U_j$ that is always on. When the node $E_j$ has been pulled up to the H level, the output voltage of the driver $D_j$ goes to the L level, and the Y-address line $YS_j$ is disabled.

In the conventional decoders, when the selected node $E_j$ is discharged, a discharge current flows so as to feed through the PMOS transistor $U_j$, NMOS transistor $K_j$, and the common transistors 130, 132 between the voltage power supply terminals $V_{cc}$ and $V_{ss}$. Because this discharge feed through flows every time memory access is carried out, the power consumption of the entire DRAM markedly increases.

Also, because the voltage of the threshold components is lowered in the respective NMOS transistor $K_j$ and the common transistors 130, 132 as a result of this current feedthrough, there is also concern that the voltage of the selected node $E_j$ will not be pulled down completely below the threshold value of the L level, and as a result, there is also concern that the feedthrough current will flow within the driver $D_j$.

A typical circuit construction of the driver D is shown in FIG. 8. In this CMOS inverter, the NMOS transistor NT constitutes a drive element, and the PMOS transistor PT constitutes a load element. When the input (node E) is at the H level, the NMOS transistor NT is on, the PMOS transistors PT is off, and the output (YS) goes to the L level. When the input (node E) is at the L level, the NMOS transistor NT is off, the PMOS transistors PT is on, and the output (YS) goes to the H level. In either case, since both transistors NT, PT are in a complementary (mutually opposite) state, it comes to be expected that current does not flow.

However, in the conventional column decoder, when the selected node $E_j$ is not sufficiently lowered to the L level, in addition to the PMOS transistor PT being almost on, the NMOS transistor NT is also almost on, and current flows through both the transistors NT, PT. When this type of feedthrough current flows within the driver D, there is concern that transistor elements NT, PT will deteriorate and break down.

In order to prevent this feedthrough current within the driver D, the method for sufficiently increasing the threshold voltage of the NMOS transistor NT has been considered. However, with this method when the node $E_j$ is restored from the L level to the H level after memory access is completed, the inversion of the output voltage at the driver $D_j$ is delayed, the returning of the Y-address line $YS_j$ to the disabled state is delayed, and there is concern that duplicate selection of another Y-address line YS immediately after being enabled may occur, it cannot be considered a suitable method.

For this reason, conventionally, there was no way to deal with this type of situation other than finely turning the width and length of the channel in the NMOS transistor NT, and the circuit design and semiconductor manufacturing processes had to be subjected to stringent conditions.

Our invention was developed taking the problems of the prior art into consideration, and its purpose is to offer an address decoder that solves the problems of feedsthrough current or leakage current at their root causes, and realizes a large reduction in the power consumption.

SUMMARY OF INVENTION

In order to achieve the purposes, the first address decoder of our invention is one that operates in response to a first address signal comprising a number of address bits containing the selected or unselected information in regard to a corresponding single unit within prescribed multiple rows or columns, and a second address signal containing the selected or unselected information in regard to the respective rows or columns in a single unit within the multiple rows or columns, and which selectively enables the number of rows or columns, and is constituted of a number of transfer gates with an input terminal to which the first address signal is supplied, and a gate terminal to which each corresponding address bit within the second address signal or inverted address bit at the opposite level is supplied; a number of transistors with a first terminal coupled to a reference voltage terminal, a second terminal coupled to the output terminal corresponding to each of the transfer gates, and a control terminal to which each corresponding address bit within the second address signal or the inverted address bit at the opposite logic level is supplied; and a number of driver circuits with input terminals that are electrically connected to the output terminals of each of the corresponding transfer gates and the second terminal of each of the corresponding transistors, and an output terminal coupled to each of the corresponding rows or columns.

The second address decoder of our invention is one that operates in response to a first address signal comprising a number of address bits containing the selected or unselected information in regard to a corresponding single unit within prescribed multiple rows or columns, and a second address signal containing the selected or unselected information in regard to the respective rows or columns in the single unit within the multiple rows or columns, and which selectively enables the number of rows or columns, and is constituted of a number of CMOS transfer gates with an input terminal to which the first address signal is supplied, and a gate terminal to which each corresponding address bit within the second address signal or inverted address bit at the opposite logic level is supplied; a number of transistors with a first terminal coupled to a reference voltage terminal, a second terminal coupled to the output terminal corresponding to each of the CMOS transfer gates, and a control terminal to which each corresponding address bit within the second address signal or inverted address bit at the opposite logic level is supplied; and a number of driver circuits with input terminals that are electrically connected to the output terminals of each of the corresponding CMOS transfer gates and the second terminal of each of the corresponding transistors, and an output terminal coupled to each of the corresponding rows or columns.

In the figures, 10 is a NAND circuit, $C_0$–$C_7$ a CMOS transfer gate, $P_0$–$P_7$ are PMOS transistor, $F_0$–$F_7$ a node, $D_0$–$D_7$ a driver, $N_0$–$N_7$ a NMOS transfer gate, $YS_0$–$YS_7$ a Y selector line, 100 a memory array, and MC a memory cell.

DETAILED DESCRIPTION

Figure 1:
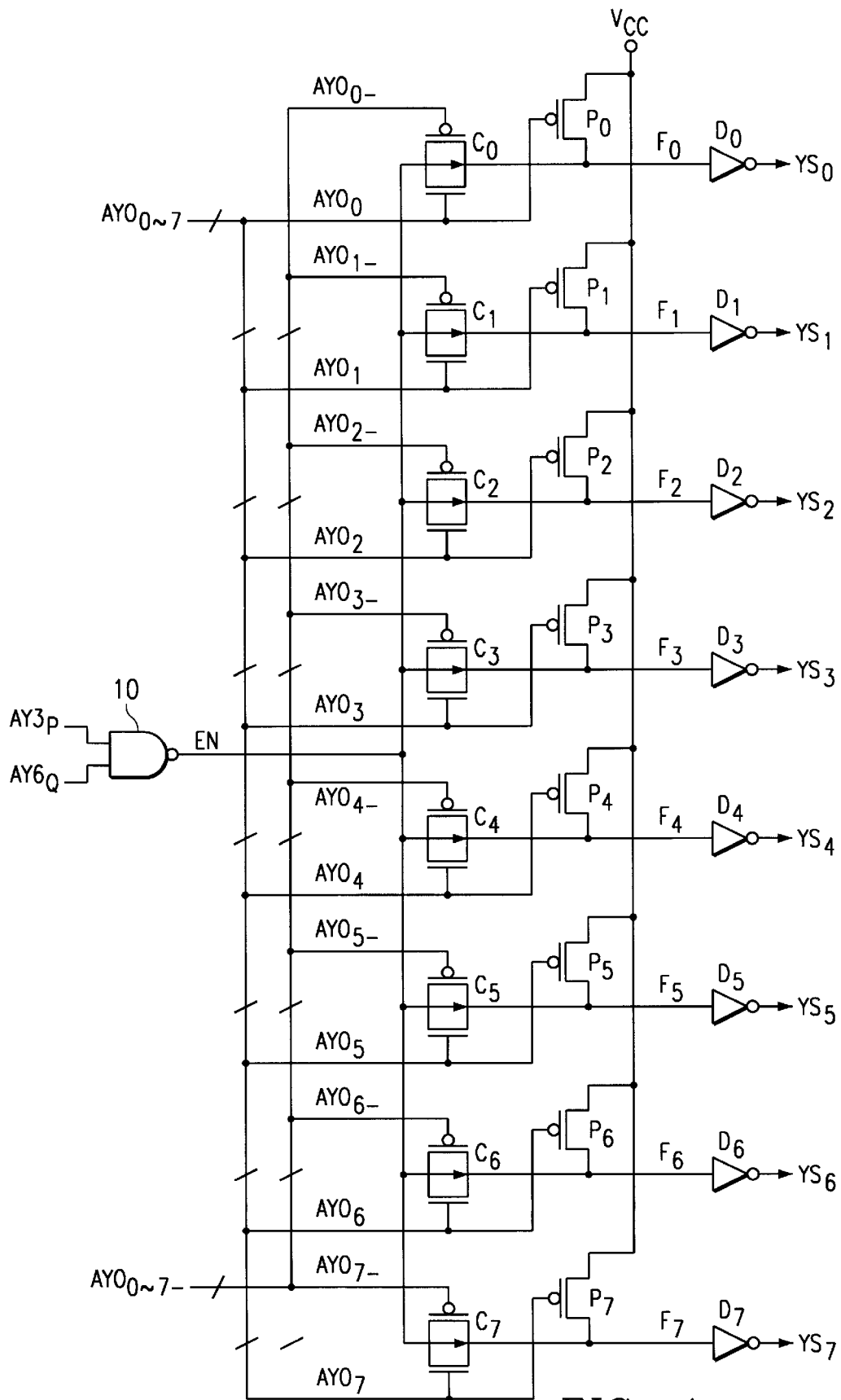
FIG. 1 is a schematic of a column decoder according to one embodiment of our invention.
Figure 4:
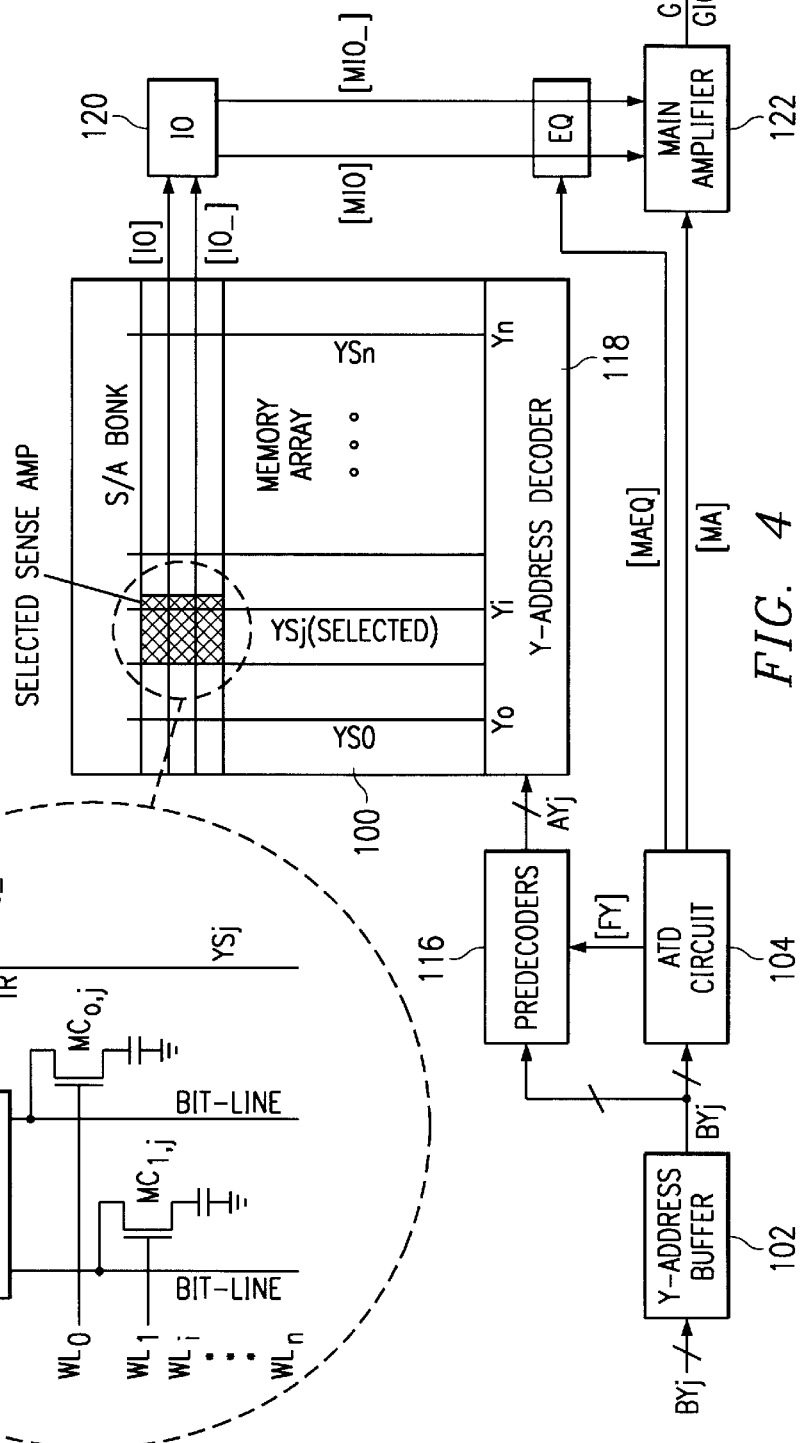
FIG. 4 is a block of a typical conventional DRAM.
Figure 5:
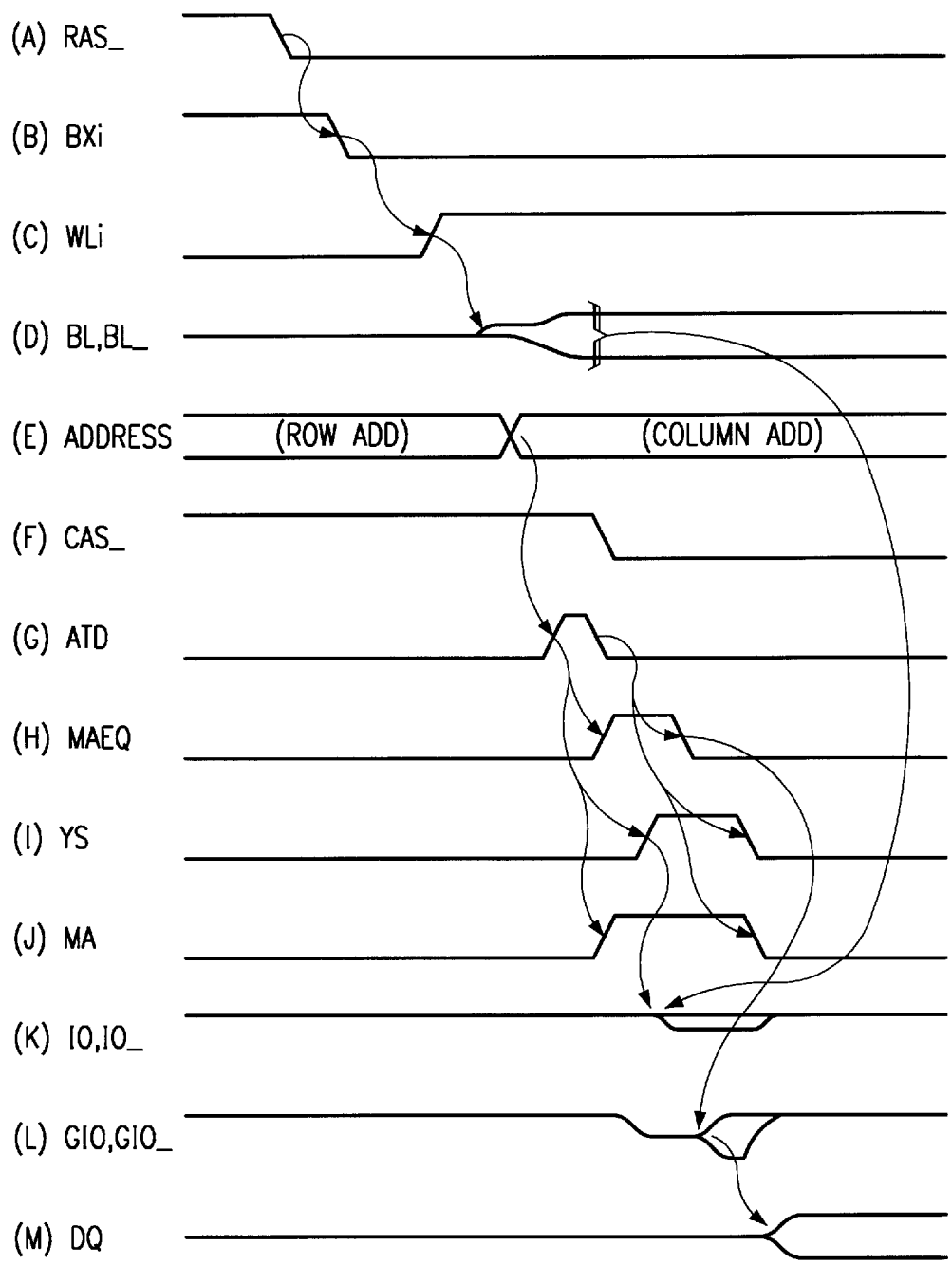
FIG. 5 is a signal waveform diagram showing each portion of the signal, data waveform, and timing during memory access in the conventional DRAM of FIG. 4.
Figure 6:
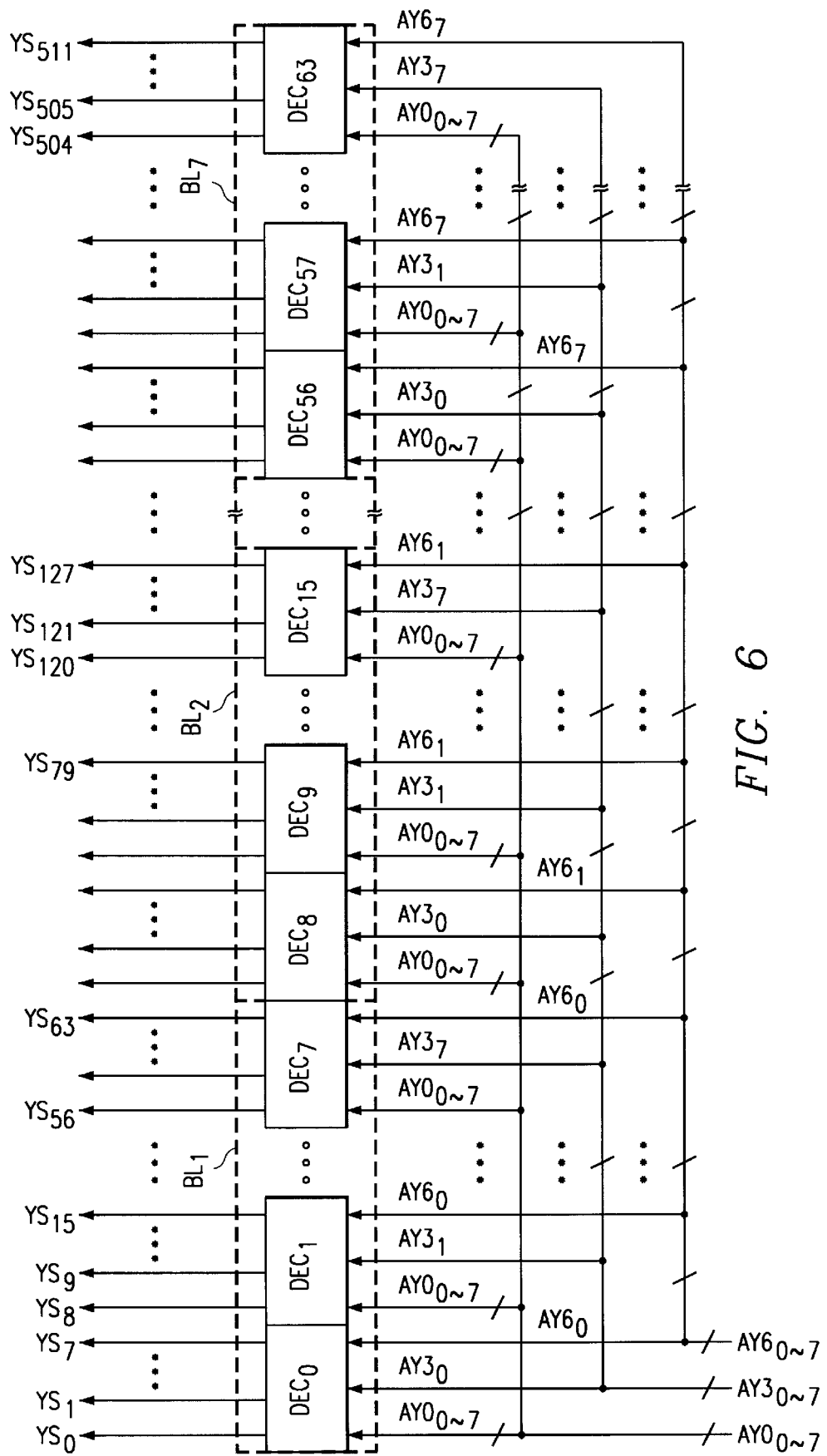
FIG. 6 is a block diagram of an example of apportioning the address signal and an internal unit of the Y-address decoder 118 in the DRAM of FIG. 4.
Figures 7, 8:
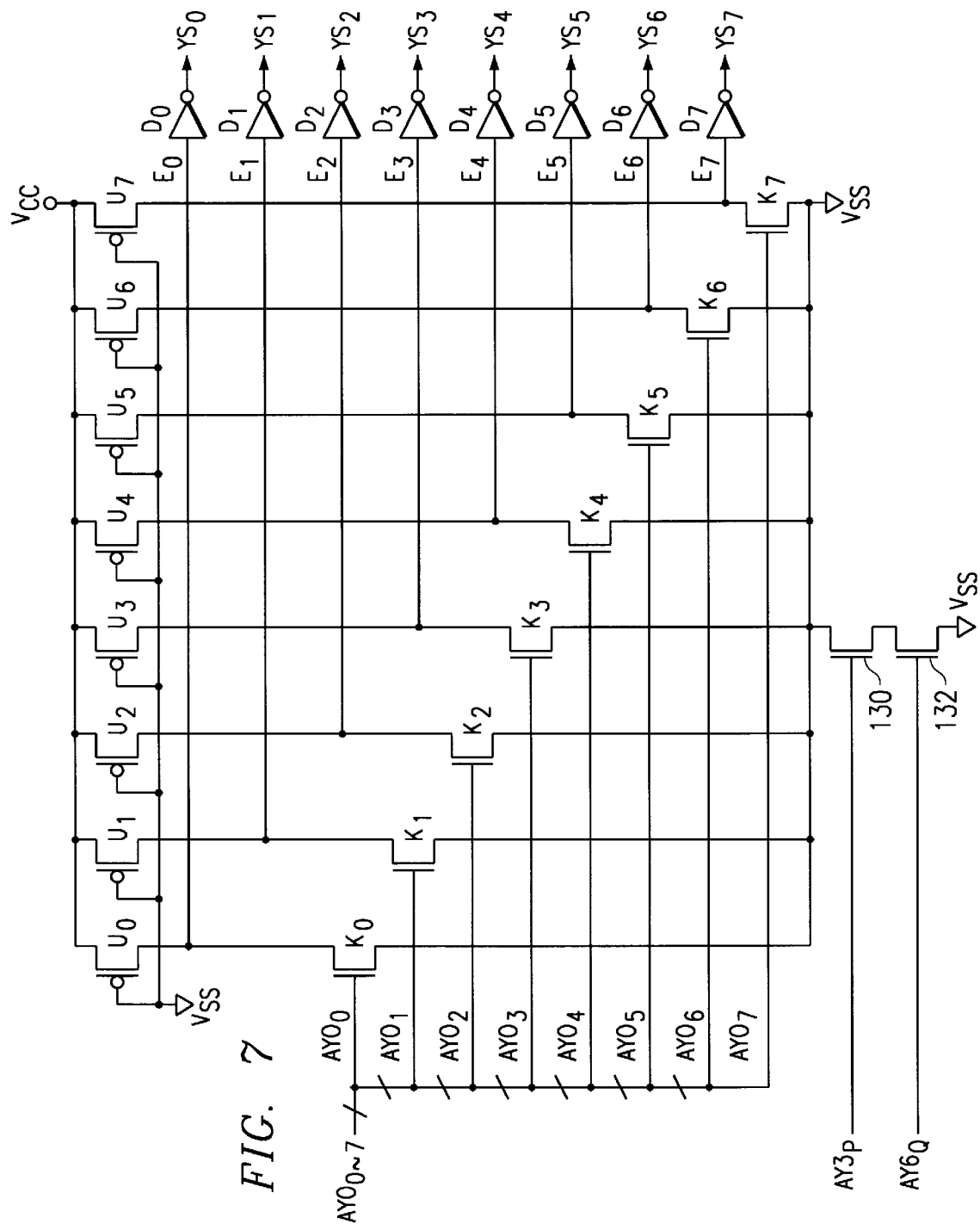
FIG. 7 is a schematic of a conventional column decoder.
FIG. 8 is a schematic of a CMOS inverter used in a driver of the column decoder of FIG. 7.

Some embodiments of our invention will be explained with reference to FIGS. 1–3. FIG. 1 shows a column decoder according to one embodiment of our invention. This column decoder can be used, for example, as the column decoder (DEC) which constitutes the Y-address decoder 118 of the DRAM of FIGS. 4–6.

This column decoder is constructed of the eight CMOS transfer gates $C_0$–$C_7$, PMOS transistors P0–$P_7$, inverter drivers $D_0$–$D_7$ and the single NAND circuit (10).

In the column decoder of this embodiment, there is not only a direct input of the address bits $AY0_0$–$AY0_7$ of the first partial address signal $AY0_{0-7}$, but these address bits $AY0_0$–$AY0_7$ are also input as inverted address bits $AY0_{0-}$–$AY0_{7-}$ in which the logic level has been inverted through the respective inverters (not illustrated).

The address bits $AY0_0$–$AY0_7$, along with being supplied to the n-type gate terminals of the respective CMOS transfer gates $C_0$–$C_7$, are supplied to the gate terminals of the respective PMOS transistors $P_0$–$P_7$. On the other hand, the inverted address bits $AY0_{0-}$–$AY0_{7-}$, are supplied to the p-type gate terminals of the respective CMOS transfer gates $C_0$–$C_7$.

The address bits $AY3_p$ corresponding to the second partial address signal $AY3_{0-7}$ and the address bits $AY6_q$ corresponding to the third partial address signal $AY6_{0-7}$, which are used as the enable signal for this column decoder, are respectively input to the pair of input terminals of the NAND circuit 10. The output terminal of the NAND circuit 10 is connected to the input terminals of the CMOS transfer gates $C_0$–$C_7$.

The output terminals of the CMOS transfer gates $C_0$–$C_7$, along with being connected to the input terminals of the respective drivers $D_0$–$D_7$ through the medium of the nodes $F_0$–$F_7$, are connected to the drain terminals of the PMOS transistors $P_0$–$P_7$. The source terminals of the PMOS transistors $P_0$–$P_7$ are connected to the power supply voltage terminal $V_{cc}$ of, for example, 3.3 V. The output terminals of the drivers $D_0$–$D_7$ are connected to the Y-address lines $YS_0$–$YS_7$.

In a column decoder with this type of construction, in the interval in which a column address signal $AY_j$ is not applied, because all of the address bits $AY0_0$–$AY0_7$ are at a logic level of 0 (L level), and on the other hand, all of the CMOS transfer gates $C_0$–$C_7$ are in a cutoff state and all of the PMOS transistors $P_0$–$P_7$ are on. Therefore, all of the nodes $F_0$–$F_7$ are at the H level, the voltage outputs of all of the drivers $D_0$–$D_7$ are at the L level, and all of the Y-address lines $YS_0$–$YS_7$ are maintained in the disabled state.

When a column address signal $AY_j$ is applied, one among the address bits $AY0_0$–$AY0_7$ is at a logic level of 1 (H level) and all of the others are at a logic level of 0 (L level). For example, assume that $AY0_2$ has gone to a logic level of 1 (H level). In this case, since the $AY0_2$ at the H level is supplied to the n-type gate terminals, while $AY0_{2-}$ at the L level is supplied to the p-type gate terminals, the CMOS transfer gate $C_2$ enters the on (conducting) state. All of the other CMOS transfer gates $C_0$, $C_1$, $C_3$–$C_7$ remain in the off (cutoff) state.

On the other hand, due to the fact that the address bit $AY0_2$ is at the H level, PMOS transistor $P_2$ enters the off state. As a result, node $F_2$ is blocked from the power supply voltage $V_{cc}$. All of the other PMOS transistors ($P_0$, $P_1$, $P_3$–$P_7$ remain in the on state.

In this way, every time an arbitrary column address signal $AY_j$ is applied, at the same time that only the CMOS transfer gate $C_j$, which corresponds to the address bit $AY0_j$ with a logic level of 1 (H level), enters the on (conducting) state, only the corresponding PMOS transistor $P_j$ enters the off state, only the corresponding node $E_j$ is disconnected from the power supply voltage $V_{cc}$, and is directly connected to the output terminal of the NAND circuit 10.

Therefore, in the event that this column decoder is selected, in other words, in the event that both of the pair of enable signals (address bits) $AY3_p$, $AY6_q$ are at a logic level of 1 (H level), the enable signal EN at a logic level of 0 (L level) is taken from the output terminal of the NAND circuit 10 as is through the CMOS transfer gate (for example, in the example, $C_2$ in the on (conducting) state and node ($F_2$) of its following stage, and supplied to the input terminal of driver ($D_2$), and at the output side of this driver ($D_2$), the Y-address line ($YS_2$) is the enabled.

When this memory access is completed and the column address signal $AY_j$ is cut off, at the same time the CMOS transfer gate ($C_2$), which had been on, returns to the normal off state, the PMOS transistor ($P_2$), which had been in the off state, is returned to the normal on state. Due to this, the node ($F_2$), which was directly connected to the output terminal of the NAND circuit 10, is directly connected to the power supply voltage $V_{cc}$ from this point in time, and the Y-address line (YS2) that was selected by this memory access is returned to the unselected state at this point in time.

In the event that this column decoder is not selected, in other words, in the event that at least one of the pair of enable signals (address bits) $AY3_p$, $AY6_q$ is at the logic level of 0 (L level), the signal EN at a logic level of 1 (H level) is taken from the output terminal of the NAND circuit 10 as is through the CMOS transfer gate (in the example, $C_2$) in the on (conducting) state and node ($F_2$) of its following stage supplied to the input terminal of driver ($D_2$), and finally, the Y-address line ($YS_2$) of the output side of this driver ($D_2$) is held in the disabled state.

In this way, with the column decoder of this embodiment, in particular, the node within the circuit corresponding to the Y-address line $YS_j$ is to be selected during memory access operates as a static circuit directly connected to the input enable signal EN through the CMOS transfer gate $C_j$ for the node $F_j$ of the input side of the driver $D_j$ in the on state, and no feedthrough current or leakage current and the like is generated. Because of this, the power consumption is markedly reduced compared to the conventional dynamic type of address decoder. Also, because it operates as a static circuit, the selection condition of each section, in particular, a return from the selected condition to the unselected condition, is fast, and there is no fear of a duplex selection condition between two Y selector lines at about the same time.

Also, because an enable cycle signal of an almost complete L level (close to 0 V) is supplied from the output terminal of NAND circuit 10 to the driver $D_j$ through the CMOS transfer gate $C_j$ and node $F_j$, there is also no fear of feedthrough current or leakage current being generated, even within the driver $D_j$.

Figure 3:
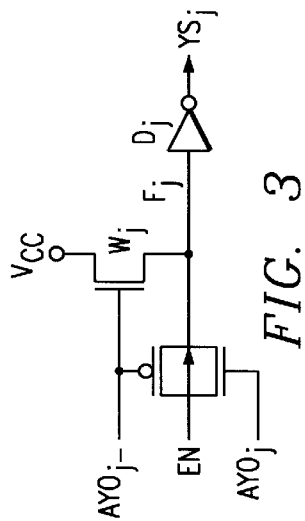
FIG. 3 is a schematic showing a variation of the essential components of a column decoder.

In this embodiment, the respective address bits $AY0_0$–$AY0_7$ were applied to the gate terminals of the PMOS transistors $P_0$–$P_7$; however, as shown in FIG. 3, it can also be a construction in which these PMOS transistors $P_0$–$P_7$ are replaced with NMOS transistors $W_0$–$W_7$, and the respective inverted address bits $AY0_0$-–$AY0_7$- are applied to the gate terminals of these NMOS transistors $W_0$–$W_7$. The inverters for generating the inverted address bits $AY0_0$-–$AY0_7$- from the address bits $AY0_0$-–$AY0_7$- can of course be provided in the internal unit of the column decoder.

Figure 2:
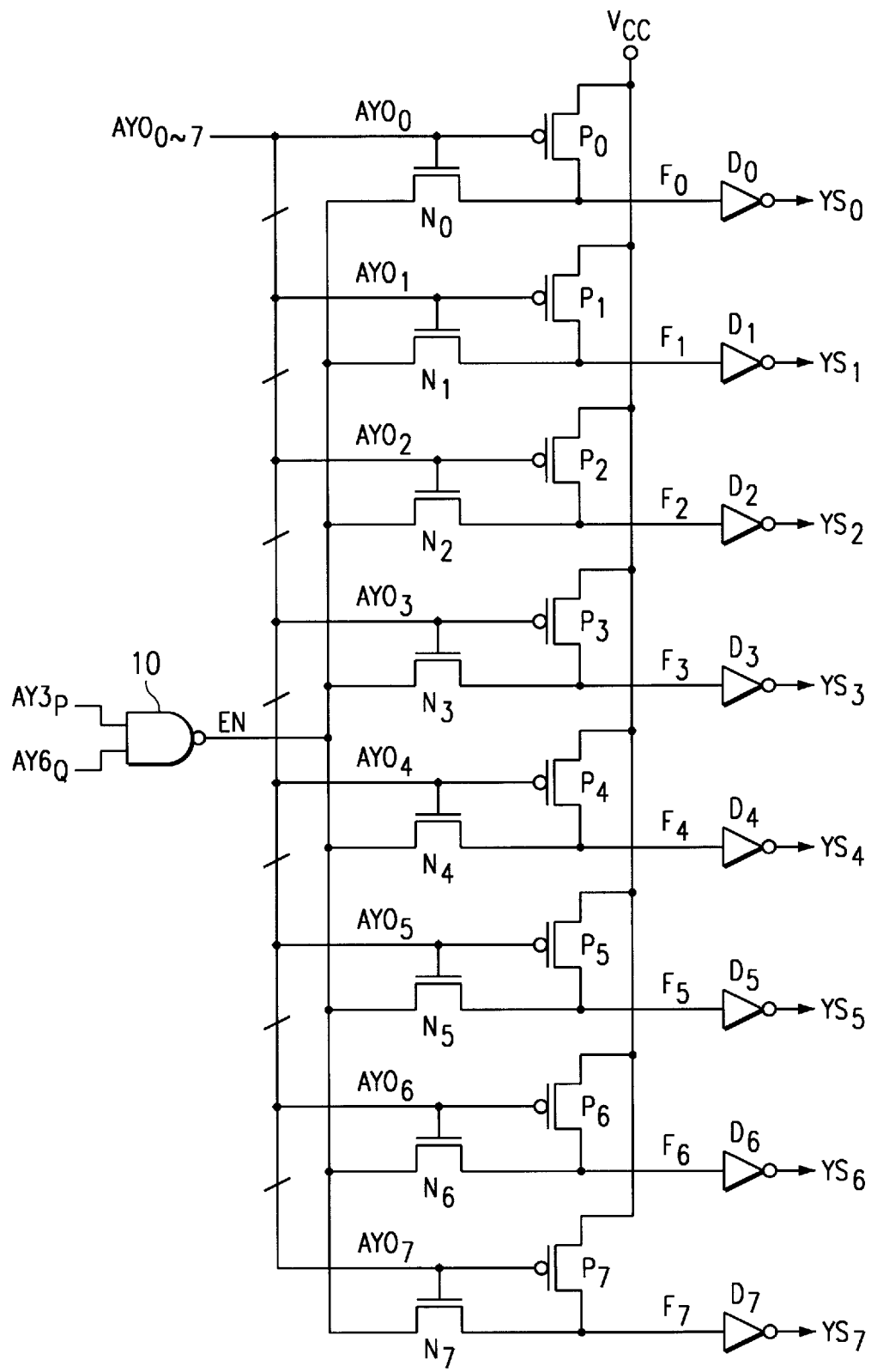
FIG. 2 is a schematic of a column decoder according to Embodiment 2 of our invention.

The circuit construction of a column decoder based on Embodiment 2 of our invention is shown in FIG. 2. This embodiment is one in which the NMOS transfer gates $N_0$–$N_7$ are used in place of the CMOS transfer gates $C_0$–$C_7$ in the Embodiment 1.

Address bits $AY0_0$–$AY0_7$ are respectively supplied to the gate terminals of the NMOS transfer gates $N_0$–$N_7$ and the gate terminals of the PMOS transistors $P_0$–$P_7$. The output terminal of the NAND circuit 10 is connected to each input terminal (drain or source terminal) of each NMOS transfer gate $N_0$–$N_7$. The output terminals of the NMOS transfer gates $N_0$–$N_7$ are connected to the drain terminals of the PMOS transistors $P_0$–$P_7$ and the input terminals of drivers $D_0$–$D_7$ via the nodes $F_0$–$F_7$, respectively.

Even with this type of construction, about the same operations are provided as with the Embodiment 1, and there are almost no problems with feedthrough current and leakage current.

However, when the selected NMOS transfer gate $N_j$ is turned on, because a voltage drop is generated that is equal to the threshold voltage, within those limits, there is a fear that a delay may be generated from the propagation of the enable signal EN to the rise or fall of the node $F_j$. Within this meaning, the column decoder of the Embodiment 1, which uses the CMOS transfer gate $C_0$–$C_7$ as the transfer gate in our invention, is more advantageous.

It should be obvious that the column decoders of the embodiments are nothing more than one embodiment of an address decoder that is applicable to our invention.

For example, each of the NMOS transfer gates $N_j$ in the Embodiment 2 can of course be replaced with PMOS transfer gates.

The number of circuit elements can be arbitrarily selected in accordance with the number of address bits. The enable signal was applied as one portion of the address signal in the embodiments, but it can equally be a signal that is applied independently of the address signal.

The driver circuits can be constructed as voltage followers in accordance with the requirements. A bipolar transistor can be used in the transistors ($P_j$ $W_j$ for placing each node $F_j$ at the power supply voltage.

The address decoder of our invention can also be used in semiconductor memory devices other than DRAMs, for example, in static RAMs, ROMs, etc., and these can also be applied to decoders for row address systems (row decoders).

As explained above, according to the address decoder of our invention, since the on/off state is controlled for each corresponding transfer gate in response to the logic level of each address bit of an address signal, and the row or column of the output side of the driver circuit is enabled in response to the logic level of the address signal by supplying the address signal to a driver circuit through a transfer gate in the on state, the problems with leakage current, feedthrough current, etc., within the decoder circuit can be solved at its root, and the power consumption can be greatly reduced.

We claim:

1. A column address decoder for a DRAM comprising:

a plurality of transfer gates, said plurality being equal to the number of bits in a first column address, each transfer gate having an input terminal, first and second control gates, said first control gate being coupled to a bit of a first address signal, said second control gate being coupled to an inverse of the signal coupled to said first control gate, and an output;

a plurality of driver circuits, said plurality being equal to the number of bits in said first column address, each being coupled to one of said outputs of said transfer gates and having an output coupled to a column of said DRAM;

a plurality of transistors, said plurality being equal to the number driver circuits, each having a first terminal coupled to a reference voltage and a second terminal coupled to one of said outputs of said transfer gates;

logic means coupled to a second column address signal for selecting said column address decoder, an output of said logic means being coupled to each input of said transfer gates;

whereby power consumption of said decoder is reduced by substantially preventing any feedthrough current from flowing in said plurality of driver circuits.

2. The column decoder of claim 1 wherein said driver activates a sense amplifier for a column in said DRAM.

3. The column decoder of claim 1 wherein said DRAM is organized as memory cells along rows and columns.

4. The column decoder of claim 1 wherein said logic means is a precoder for generating a precoded column address signal.

5. An integrated circuit having memory with a column address decoder comprising at least one decoder element comprising:

a transfer gate having an input terminal, a first control gate being coupled to a bit of a first address signal, and an output;

a transistor having a first terminal coupled to a reference voltage and a second terminal coupled to said output of said transfer gate;

a driver circuit comprising a NMOS transistor and a PMOS transistor having input gates, with said gates both connected to said output of said transfer gate and said second terminal of said transistor, and wherein the NMOS and PMOS transistors are coupled as a complementary inverter pair, coupled to said output of said transfer gate and having an output coupled to a column of memory cells;

whereby power consumption of said decoder is reduced by substantially preventing any feedthrough current from flowing in said driver circuit.

6. The integrated circuit of claim 5 further comprising a second control gate on said transfer gate being coupled to an inverse of the signal coupled to said first control gate.

7. The integrated circuit of claim 5 wherein said logic means is a precoder for generating a preceded column address signal.

* * * * *